US006202303B1

(12) United States Patent
Trobough

(10) Patent No.: US 6,202,303 B1
(45) Date of Patent: Mar. 20, 2001

(54) METHOD FOR PRODUCING HIGH EFFICIENCY HEAT SINKS

(75) Inventor: Mark B. Trobough, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/288,485

(22) Filed: Apr. 8, 1999

(51) Int. Cl.[7] ................................................. B23P 15/00
(52) U.S. Cl. ............................................. 29/890.03; 29/557
(58) Field of Search ........................... 29/890.03, 557; 72/258; 165/185

(56) References Cited

U.S. PATENT DOCUMENTS

| 3,631,586 | * | 1/1972 | Bearpark et al. | 72/258 |
| 4,192,063 | * | 3/1980 | Sato | 72/258 |
| 4,879,891 | * | 11/1989 | Hinshaw | 29/890.03 |
| 4,884,331 | * | 12/1989 | Hinshaw | 29/890.03 |
| 6,000,132 | * | 12/1999 | Butler | 29/890.03 |
| 6,101,715 | * | 8/2000 | Fuesser et al. | 29/890.03 |

FOREIGN PATENT DOCUMENTS

| 1381189 | * | 1/1975 | (GB) | 72/258 |
| 0169113 | * | 7/1986 | (JP) | 72/258 |
| 404284916 | * | 10/1992 | (JP) | 72/258 |

OTHER PUBLICATIONS

"Digital Heat Sinks: Heat Sinks for Intel Pentium Processor, Cyrix 6x86, AMD K5/K6", http://www.thermalloy.com/catalog/htm/dhs53.htm, Thermalloy, 2 pages, (Feb. 8, 1999).
"Pultrusion Process Diagram", http://www.plastictubing-.com/pult_process.html, 1997 Teel Plastics, Inc., 1 page, (Feb. 3, 1999).

* cited by examiner

Primary Examiner—I Cuda Rosenbaum
(74) Attorney, Agent, or Firm—Schwegman, Lundberg, Woessner & Kluth, P.A.

(57) ABSTRACT

A method for producing a heat sink includes extruding a first material in a second material, and cut into a billet. The second material is removed from the billet to produce a base and a plurality of fins. The second material is removed from the billet by placing the billet into a chemical bath. The heat sink is rinsed to remove chemical residue from the heat sink. Mounting holes are stamped into the base, and a mounting surface is ground on the heat sink. Another method for producing a heat sink includes ramming fins into a base. The base is heated prior to the entry of the fins. The base is also provided with dimples to accept entry of the fins.

11 Claims, 6 Drawing Sheets

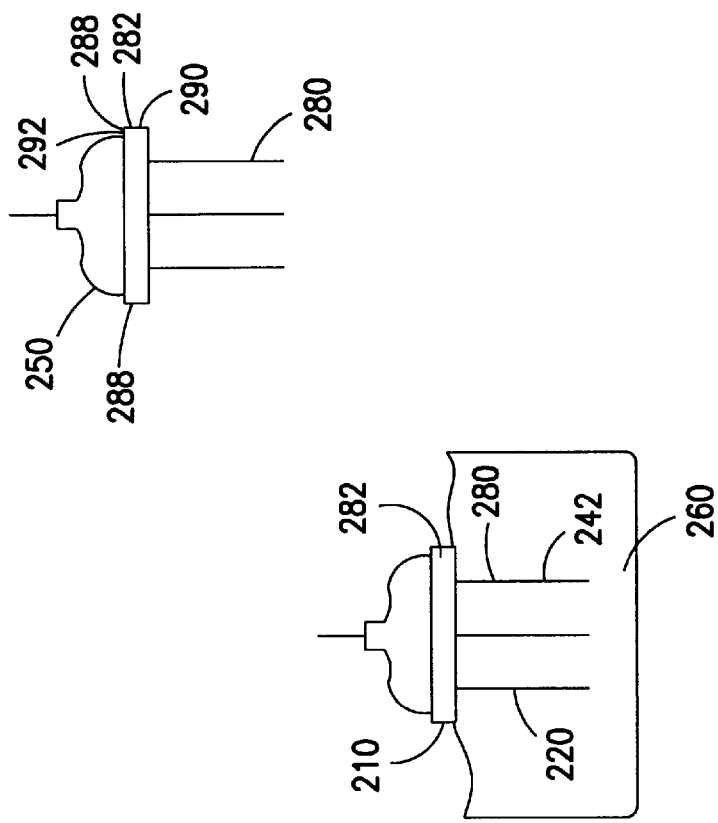
FIG. 4D
FIG. 4C
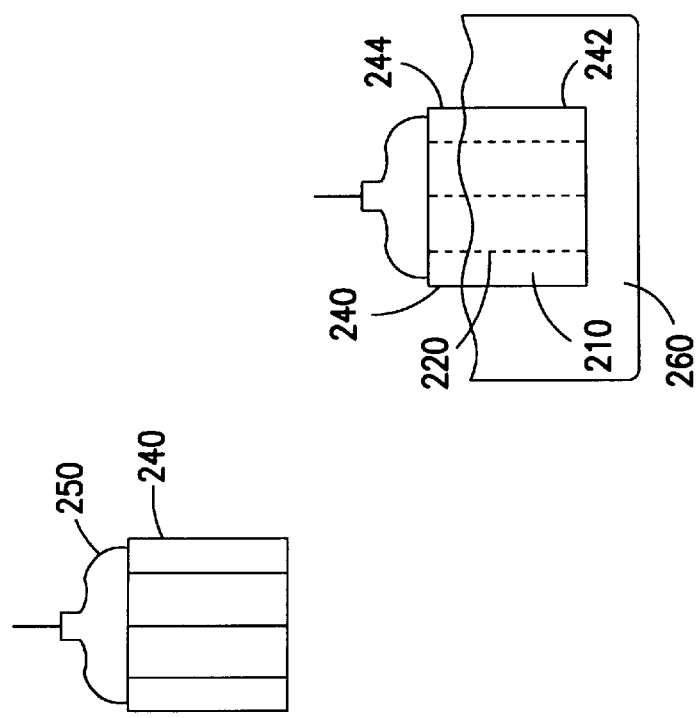
FIG. 4B
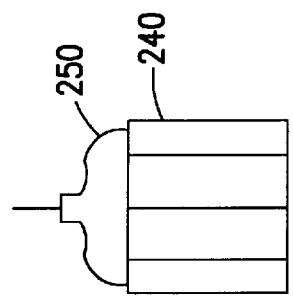
FIG. 4A

METHOD FOR PRODUCING HIGH EFFICIENCY HEAT SINKS

TECHNICAL FIELD

The present invention relates generally to heat sinks and in particular to a method for producing high efficiency heat sinks.

BACKGROUND

Processors and related computer components are becoming more powerful with increasing capabilities, resulting in increasing amounts of heat dissipated from these components. Simultaneously, package and die sizes of the components are decreasing or remaining the same, which increases the amount of heat energy given off by the component for a given unit of surface area. Furthermore, as computer related equipment becomes more powerful, more and more components are being placed inside the equipment which is also decreasing in size, resulting in additional heat generation in a smaller volume of space. Increased temperatures can potentially damage the components of the equipment, or reduce the lifetime of the individual components and the equipment.

Heat sinks have been used to assist in dissipating heat from the processor and other heat producing components within a housing. The overall size of the heat sink is limited by the volume constraints of the housing. To maximize the amount of heat dissipated from the heat producing components, there is a need to maximize the surface area of the heat sink without increasing the volume of the heat sink, such as by maximizing pin density on the heat sink. However, current manufacturing methods of heat sinks, such as machining or casting, are limited in the ability to maximize the surface area. Furthermore, some of these methods can be expensive.

For the reasons stated above, and for other reasons stated below which will become apparent to those skilled in the art upon reading and understanding the present specification, there is a need for a more efficient method to produce heat sinks. There is also a need for a heat sink which maximizes heat dissipation capabilities. What is also needed is a way to produce low cost heat sinks with higher convection surface area to heat sink volume ratio.

SUMMARY

A method for producing a heat sink includes extruding a first material in a second material, and the extrusion is cut into a billet. The second material is removed from a portion of the billet to produce a heat sink having a base and a plurality of fins. The first material, in one embodiment, is set in a pattern within the second material. In one embodiment, the second material is removed from the billet by placing the billet into a chemical bath. In another embodiment, the heat sink is rinsed to remove chemical residue from the heat sink. Optionally, mounting holes are stamped into the base, and a mounting surface is ground on the heat sink.

In another embodiment, a method for dissipating heat includes forming a heat sink by disposing fin material through a die, embedding the fin material into a base plate, and coupling the heat sink with a heat producing component. In one embodiment, the fin material is sheared by a shear plate prior to embedding the fin material into the base. Optionally, the shear plate and/or the die physically supports the fin material while it is embedded within the base plate. In another embodiment, the base is heated prior to the entry of the fins. The base is also provided with dimples to accept entry of the fins.

In one embodiment, the fin material comprises a continuous length of material, such as copper wire. In another embodiment, the fin material comprises cut-to-length fins. In yet another embodiment, the fins of the above heat sinks have circular, square, or rectangular cross-section.

BRIEF DESCRIPTION OF THE DRAWINGS

FIG. 4A illustrates a block diagram of a heat sink constructed in accordance with one embodiment.

FIG. 4B illustrates a block diagram of a heat sink constructed in accordance with one embodiment.

FIG. 4C illustrates a block diagram of a heat sink constructed in accordance with one embodiment.

FIG. 4D illustrates a block diagram of a heat sink constructed in accordance with one embodiment.

DETAILED DESCRIPTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the scope of the present inventions. The following detailed description is, therefore, not to be taken in a limiting sense, and the scope of the present invention is defined only by the appended claims and their equivalents.

Figure 1:
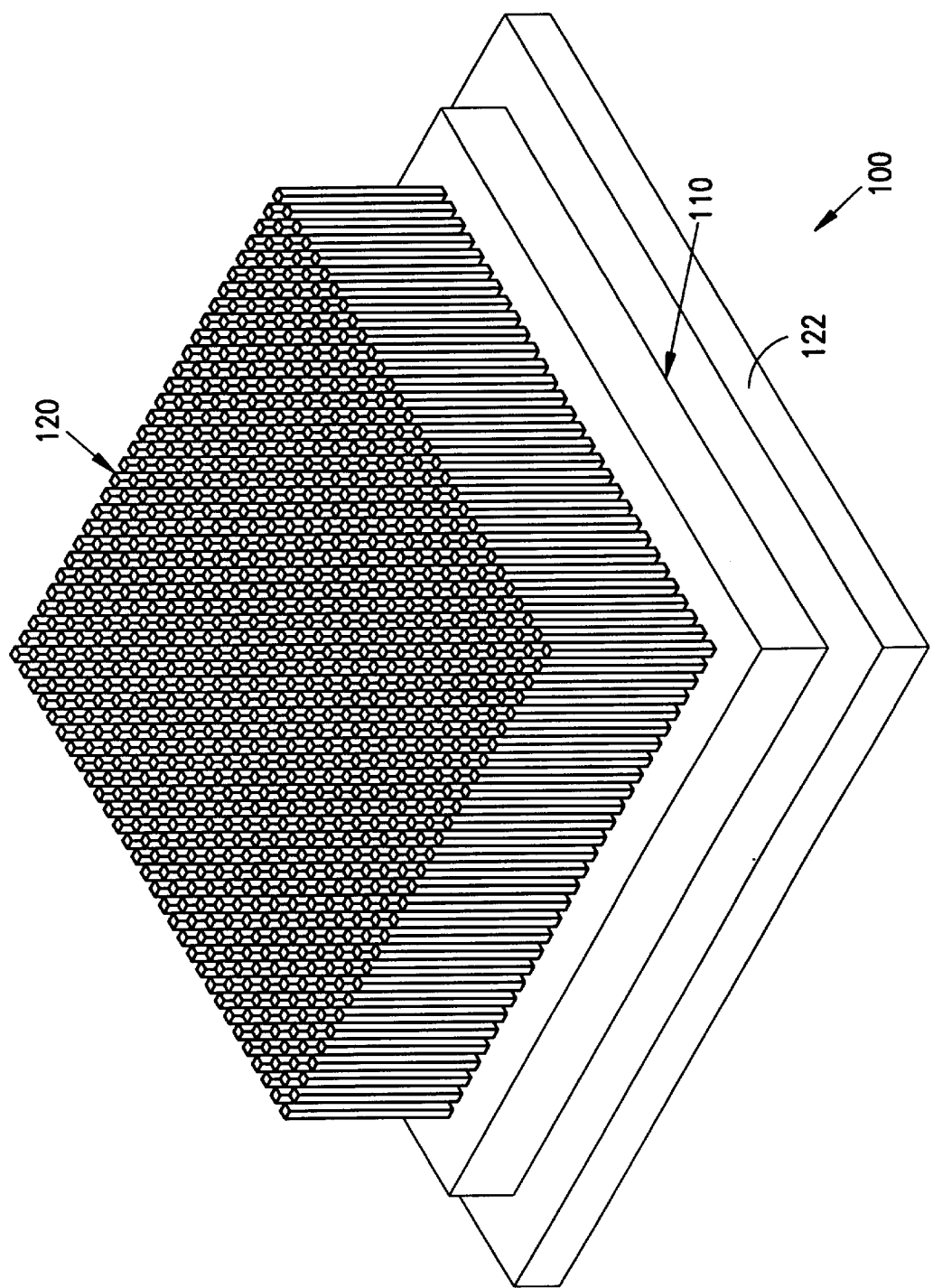
FIG. 1 illustrates a perspective view of a heat constructed in accordance with one embodiment.

FIG. 1 illustrates a heat sink 100 which is fabricated by at least one of the methods described below. The heat sink 100 includes a base plate 110 and a plurality of fins 120 extending from the base plate 110. In one embodiment, the base plate 110 is formed of a different material than the plurality of fins 120. The fins 120 are densely positioned on or within the base plate 110, which maximizes the cooling surface area for the volume of the heat sink 100. The pattern of the fins 120 is variable, and the cross-section of the fins 120 can be, among others, circular, square, or rectangular. To dissipate heat, the base plate 110 is thermally coupled with a heat producing component 122, for example, by thermally conductive epoxy. Optionally, air is drawn or moved across the fins 120 and/or the base plate 110 to further facilitate the dissipation of heat away from the heat producing component 122.

Figure 2A:
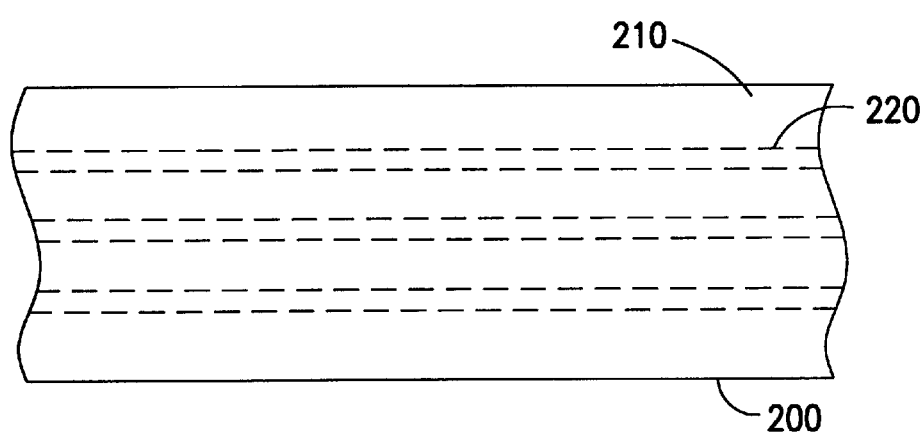
FIG. 2A illustrates a side elevation of a portion of a heat sink constructed in accordance with another embodiment.
Figure 2B:
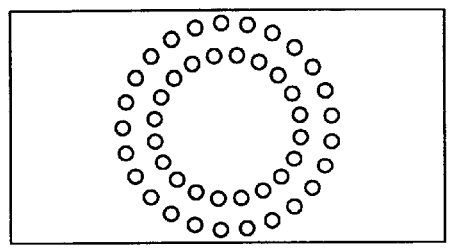
FIG. 2B illustrates a front elevation of a portion of a heat sink constructed in accordance with another embodiment.

To form a heat sink, in one embodiment, a composite structure 200 is formed. The composite structure 200, as shown in FIGS. 2A and 2B, includes a second material 220 provided within a first material 210. The first material 210 and the second material 220 are extruded or otherwise formed to dispose the second material 220 within the first material 210. In one embodiment, the first material 210 and the second material 220 are formed in a continuous length of the composite structure 200, for instance, by extrusion. Extrusion of composite material is known to those skilled in the art, and therefore will not be further described herein.

In another embodiment, the first material 210 and the second material 220 are pultruded to form the continuous length of composite material. In yet another embodiment, the first material 210 and the second material 220 are protruded to form the continuous length of composite structure 200.

It should be noted that any process can be used which allows for the first material 210 and the second material 220 to be formed together into a composite material, where the second material 220 is disposed within the first material 210. Further, additional materials, for instance a third material can also be included with the first material 210 and the second material 220. In one embodiment, the second material 220 is arranged in a pattern, for instance, in a circular pattern 232, as shown in FIG. 2B. Alternatively, other patterns can also be used. In addition, the cross-section of the second material 220, which will form fins of the heat sink, has, in one embodiment, a circular cross-section. In another embodiment, the second material 220 has a square cross-section.

Figure 3:
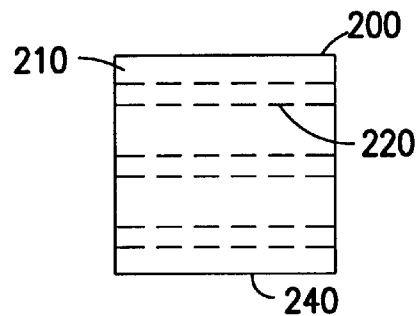
FIG. 3 illustrates a side elevation of a billet constructed in accordance with one embodiment.

After the composite structure 200 has been formed by the above described processes, the composite structure 200 is cut in to a length of material, or a billet 240, which is illustrated in FIG. 3. The billet 240 length should be that of the desired length of the base 110 and the fins 120 combined, as shown in FIG. 1.

FIGS. 4A–4D illustrate a process for forming the heat sink 100 from the billet 240. As shown in FIG. 4A, the billet 240 is re-oriented and secured by a fixture 250, in one embodiment, a vacuum fixture. The fixture 250 is adapted to secure the billet 240 such that it can be manipulated through the next described processes. As shown in FIG. 4B, the billet 240 is lowered into a chemical bath 260 such that a portion of the billet 240 is immersed therein. A first portion 242 of the billet 240, which is to become the fins of the heat sink 100, is immersed into the chemical bath 260. A second portion 244 of the billet 240, which is to become the base 110 of the heat sink 100, remains out of the chemical bath 260.

Once disposed in the chemical bath 260, the first material 210 is dissolved, thereby exposing the second material 220 for the length of the first portion 242, as illustrated in FIG. 4C. After the first material 210 is removed from the second material 220, fins 280 and a base 282 are formed. The fins 280 and the base 282 form a heat sink 290, which is removed from the chemical bath 260, as shown in FIG. 4D. In another embodiment, the heat sink 290 is further treated, for instance, by a rinse process to remove chemical residue from the fins 280 and/or the base 282.

Variations to the above process, include, but are not limited to the following. In one embodiment, a pop-out member are provided in the base 282 in the extrusion at a desired mounting hole location. In another embodiment, mounting holes 288 are stamped in the base 282 after formation of the heat sink 290. In yet another embodiment, a mounting surface 292 (See FIG. 4D) of the base 282 is ground to provide flatness or other surface finish requirements.

The material for the first material 210 comprises, in one embodiment, a different material than that of the second material 220. The first material 210 is capable of being extruded, and is able to bind or hold the second material 220 in a particular pattern during extrusion or other forming process. Alternatively, in another embodiment, the first material 210 is capable of being pultruded or protruded. The first material 210, in one embodiment, comprises a thermally conductive material. In addition, the first material 210, in another embodiment, is dissolvable in a chemical bath, as discussed below. In one embodiment, the first material 210 comprises copper.

The second material 220, which forms the fins of the heat sink, is of a different material than the first material 210. The second material 220 is capable of being extruded, pultruded, or protruded within the first material 210. The second material 220, in one embodiment, comprises a thermally conductive material. In another embodiment, the second material 220 is able to resist dissolving when immersed in a chemical bath, as discussed below. In one embodiment, the second material 220 comprises aluminum.

The chemical bath 260 comprises material which is caustic to the first material 210 such that the first material 210 is dissolved by immersion in the chemical bath 260. In one embodiment, the chemical bath 260 comprises ferric chloride. In another embodiment, the chemical bath 260 comprises nitric acid. The concentration of the chemical bath 260 can be varied to accommodate different first materials and second materials, so long as the chemical bath 260 dissolves the first material 210, but does not dissolve the second material 220. Another embodiment includes multiple chemical baths, where more than one different chemical bath of another chemical is used to remove the first material 210 from the second material 220.

Figure 5:
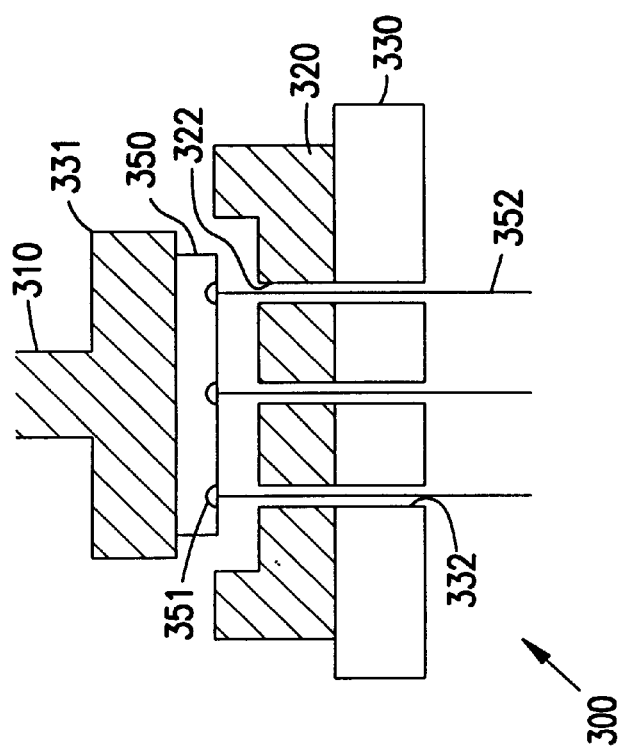
FIG. 5 illustrates an apparatus for forming a heat sink constructed in accordance with another embodiment.

FIGS. 5–8 illustrate another embodiment for forming the heat sink 100 (See FIG. 1), which includes the base plate 110 and fins 120. A heat sink forming apparatus 300 is shown in FIG. 5, which includes a ramming mechanism 310, a die 320, and a shear plate 330. The ramming mechanism 310, in one embodiment, comprises a ram and is able to provide force to a component toward the die 320, as will be further described below. The ramming mechanism 310, in another embodiment, comprises a hydraulic press. In yet another embodiment, the ramming mechanism 310 comprises a mechanical press. In one embodiment, the ramming mechanism 310 provides an impact force. In another embodiment, the ramming mechanism 310 provides a smooth application of pressure. In yet another embodiment, the ramming mechanism 310 provides a ballistic application of pressure.

The heat sink forming apparatus 300, in another embodiment, includes a part extraction device 331, which facilitates mass production of heat sinks. The part extraction device 331 assists in placing and/or removing the heat sink, or parts thereof, to and from the heat sink forming apparatus 300. The part extraction device 331 includes, in one embodiment, a vacuum pick-up which forms part of the ramming mechanism 310. In another embodiment, the part extraction device 331 comprises a magnet which is coupled with, or is integral to the ramming mechanism 310.

To form a heat sink, as shown in FIG. 5, fin material 352 is disposed through openings 322 of the die 320, and openings 332 of the shear plate 330, such that a portion 354 of the fin material 352 extends from the die 320. The openings 322 of the die 320 and the openings 332 of the shear plate 330 are substantially aligned, which allows for the fin material 352 to be extended therethrough. The openings 322 and 332 are sized to provide physical support to the fin material 352 during the forming and the shearing processes. Furthermore, the openings 322 of the die 320 are sized and positioned to assist in proper placement of the fin material 352 within the base plate 350. In another embodiment, the shear plate 330 is magnetic to assist in holding the fin material 352 in place after it is cut by the shear plate 330.

A base plate 350 is placed on fin material 352, for instance, by the part extraction device 331. In one embodiment, the base plate 350 includes dimples 351 on a surface 353 in which the fin material 352 will be embedded. The material of the base plate 350 is thermally conductive, and is softer than the material of the fin material 352. In one embodiment, the base plate 350 material comprises aluminum alloy 1100. The fin material 352 is thermally conductive and has a higher strength than the material of the base plate 350. Suitable materials for the fin material 352 include, but are not limited to, copper, aluminum, and bi-metallic wire, such as copper-clad steel, aluminum-clad steel, and aluminum-clad copper. In another embodiment, the fin material 352 comprises continuous wire which is fed through the openings 322, 332. In yet another embodiment, the fin material 352 comprises cut-to-length fins which are fed by the shear plate 330. The cross-section of the fin material 352 comprises square, rectangular, circular shapes or others.

Figure 6:
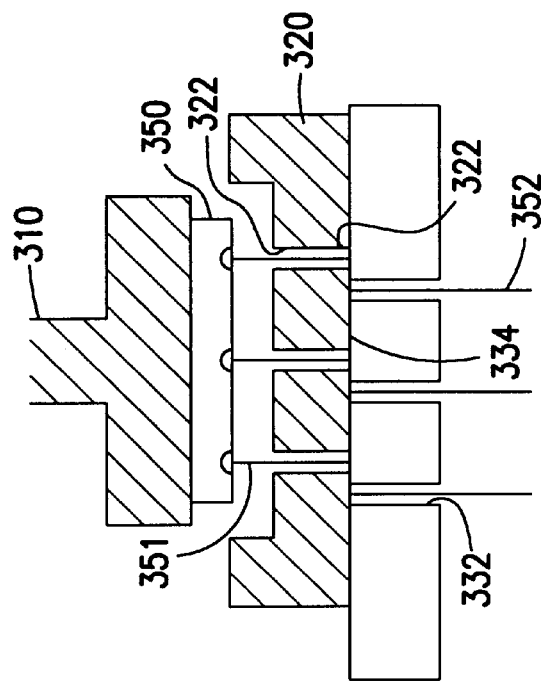
FIG. 6 illustrates an apparatus for forming a heat sink constructed in accordance with one embodiment.

As illustrated in FIG. 6, the fin material 352 is cut by the shear plate 330 into fins 354. The shear plate 330, in one embodiment, is displaced from the die 320 such that the openings 332 of the shear plate 330 are offset from the openings 322 of the die 320. The shear plate 330, in this position, provides a backstop 334 for the fins 354.

Figure 7:
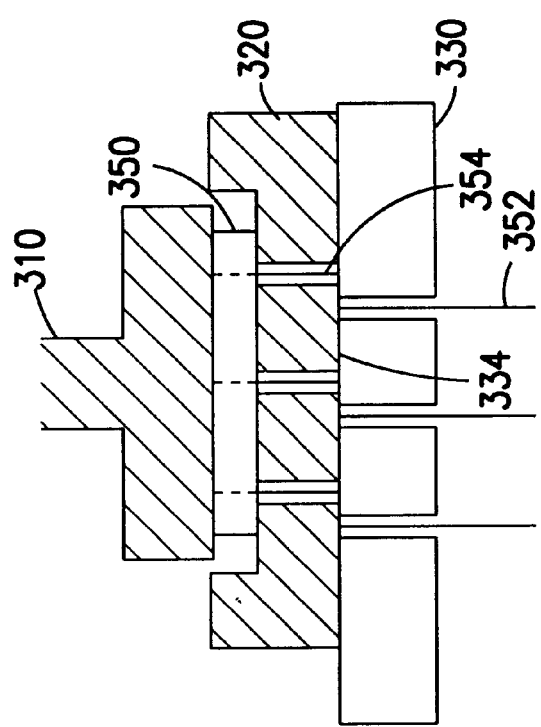
FIG. 7 illustrates an apparatus for forming a heat sink constructed in accordance with one embodiment.

Referring to FIG. 7, the ramming mechanism 310 forces the base plate 350 toward the shear plate 330 and the die 320 and on to the fins 354. The base plate 350 is forced toward the die 320 until, in one embodiment, the base plate 350 rests against a contact surface 326 of the die 320. The force from the ramming mechanism embeds the fins 354 within the base plate 350 to form a heat sink 358. In another embodiment, the ramming mechanism 310 presses the base plate 350 towards the shear plate 330 and the die 320. In one embodiment, the base plate 350 is heated prior and/or during the embedding process.

Figure 8:
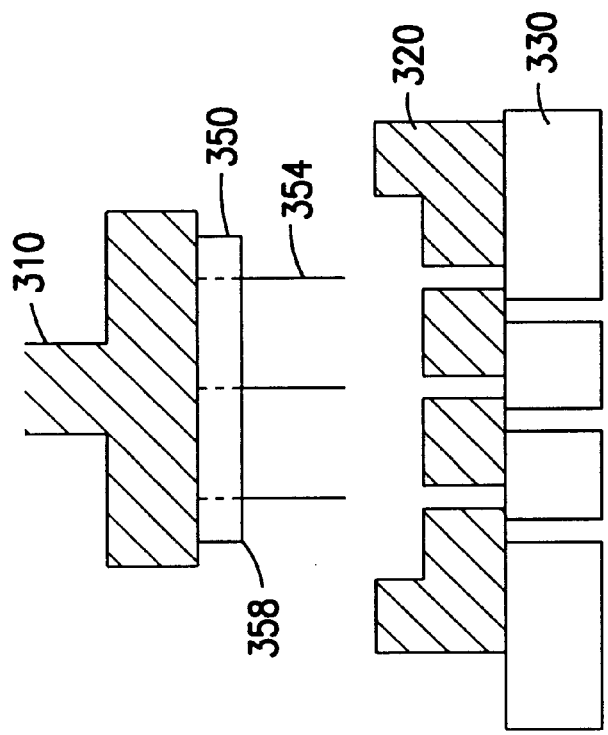
FIG. 8 illustrates an apparatus for forming a heat sink constructed in accordance with one embodiment.

After the heat sink 358 is formed, the ramming mechanism 310 retracts, as shown in FIG. 8, and in one embodiment, removes the formed heat sink 358 from the die 320. The heat sink 358 is further treated, for instance, by polishing the mounting surface, or by providing mounting holes in the heat sink 358.

Figure 9:
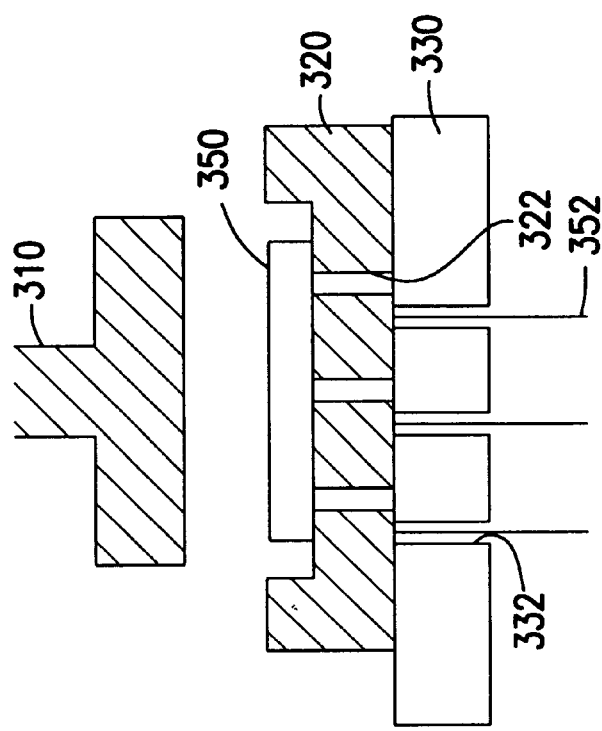
FIG. 9 illustrates an apparatus for forming a heat sink constructed in accordance with one embodiment.

To form a heat sink in another embodiment, as shown in FIG. 9, a base plate 350 is inserted into the die 320, for example using a part extraction device. The die 320 and/or the shear plate 330 are moved such that the openings 322 of the die 320 are aligned with the openings 332 of the shear plate 330. The openings 322 and 332 are sized to provide physical support to the fin material 352 during the forming and the shearing processes. Furthermore, the openings 322 of the die 320 are sized and positioned to assist in proper placement of the fin material 352 within the base plate 350.

Figure 10:
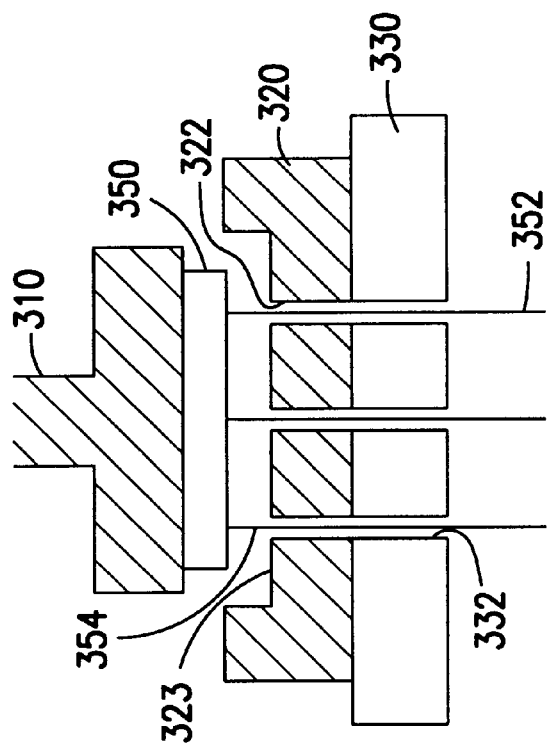
FIG. 10 illustrates an apparatus for forming a heat sink constructed in accordance with one embodiment.

Fin material 352 is fed through openings 322 of the die 320, and openings 332 of the shear plate 330, such that a portion 354 of the fin material 352 extends from the die 320 and raises the base plate 350 above a surface 323 of the die 320. The fin material 352 is inserted through the openings 322, 332 until it is stopped by the base plate 350 resting against the ramming mechanism 310, as shown in FIG. 10, which assists in controlling the length of the fin material 352 embedded within the base plate 350. Once the fin material 352 is disposed within the die 320, the ramming mechanism 310 forces the fin material 352 into the base plate 350 as discussed above.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method to produce a heat sink comprising:

extruding a composite structure which includes a second material within a first material;

cutting a billet of the composite structure; and removing the first material from a portion of the billet to form a heat sink including a base formed of the first material and fins formed of the second material.

2. The method as recited in claim 1, wherein removing the first material comprises placing the portion of the billet within a chemical bath.

3. The method as recited in claim 2, further comprising rinsing chemical residue from the heat sink.

4. The method as recited in claim 1, further comprising setting a pattern of the second material within the first material.

5. The method as recited in claim 1, wherein the first material comprises copper.

6. The method as recited in claim 1, wherein the second material comprises aluminum.

7. The method as recited in claim 1, further comprising coupling the billet with a vacuum fixture prior to removing the first material from the billet.

8. The method as recited in claim 1, further comprising stamping mounting holes within the base.

9. The method as recited in claim 1, further comprising grinding at least one surface of the base.

10. The method as recited in claim 1, wherein extruding a composite structure comprises extruding the second material having a circular cross-section.

11. The method as recited in claim 1, wherein extruding a composite structure comprises extruding the second material having a square cross-section.

* * * * *